United States Patent [19]

Salour et al.

[11] Patent Number: 4,462,103
[45] Date of Patent: Jul. 24, 1984

[54] TUNABLE CW SEMICONDUCTOR PLATELET LASER

[75] Inventors: Michael M. Salour, Cambridge, Mass.; Charles B. Roxlo, Fanwood, N.J.; Dick Bebelaar, Amsterdam, Netherlands

[73] Assignee: The United States of America as represented by the Secretary of the Air Force, Washington, D.C.

[21] Appl. No.: 361,021

[22] Filed: Mar. 23, 1982

[51] Int. Cl.³ .................................................. H01S 3/04
[52] U.S. Cl. ........................................ 372/35; 372/20; 372/43
[58] Field of Search ............. 372/43, 108, 18, 20, 372/35, 107, 70, 100, 34

[56] References Cited

U.S. PATENT DOCUMENTS

| | | | |
|---|---|---|---|
| 3,568,087 | 3/1971 | Phelan et al. | 331/94.5 |
| 3,679,994 | 7/1972 | Ngwyen | 331/94 |
| 3,983,507 | 9/1976 | Tang et al. | 331/94.5 M |
| 3,995,231 | 11/1976 | Johnson et al. | 331/94.5 M |
| 4,173,001 | 10/1979 | Koepf | 331/94.5 C |
| 4,196,402 | 4/1980 | Butler et al. | 372/43 |
| 4,264,877 | 5/1981 | Stuppaerts | 372/18 |
| 4,268,801 | 4/1981 | Grischkowsky et al. | 372/20 |

OTHER PUBLICATIONS

Roxlo et al., "Optically Pumped Semiconductor Platelet Lasers", *IEE JQE.*, vol. QE-18, No. 3, Mar. 1982, pp. 338-342.
Roxlo et al., "Synchronously Pumped Mode-Locked CdS Platelet Laser", *App. Phys. Lett.*, 38, (10), May 15, 1981.
Rotman et al., "Pulse-Width Stabilization of a Synchronously Pumped Mode-Locked Dye Laser," *Appl. Phys. Lett.*, Jun. 1, 1980, pp. 886-888.

*Primary Examiner*—James W. Davie
*Attorney, Agent, or Firm*—Donald J. Singer; Jacob N. Erlich

[57] ABSTRACT

A tunable CW semiconductor platelet laser having an optical pump source and an external resonant cavity. The resonant cavity is bounded by a pair of spaced-apart reflective elements and has a prism therein. One of the reflective elements is partially transmissive and rotatable about its vertical axis. The semiconductor platelet is mounted upon the other reflective element and both are mounted within a temperature controlled, vacuum environment while being capable of being moved in three dimensions. The prism located within the resonant cavity aids in laser tuning upon rotation of the partially transmissive reflective element.

14 Claims, 2 Drawing Figures

TUNABLE CW SEMICONDUCTOR PLATELET LASER

STATEMENT OF GOVERNMENT INTEREST

The invention described herein may be manufactured and used by or for the Government for governmental purposes without the payment of any royalty thereon.

BACKGROUND OF THE INVENTION

This invention relates generally to semiconductor lasers and, more particularly, to a continuous wave optically pumped tunable semiconductor laser having an external resonant cavity.

Lasers exist in many shapes and forms, yet the search for new types of lasers continues unabated. Lasers vary greatly in many aspects such as, for example, power, operating wavelength, cavity design, method of pumping and mode discipline (mode-locking, single-frequency, or chaotic operation). The single, most frequent means of laser identification is by the type of gain medium utilized within the laser, since the medium will strongly influence, if not dictate, the other considerations of laser design.

Optically pumped semiconductor lasers are of especially great interest because of their potential for becoming a convenient, tunable, coherent source of electromagnetic radiation throughout the visible and near IR range of the spectrum. The most distinguishing feature of a semiconductor laser is that it does not deal with gain centers (atoms, ions, molecules, complexes) sparsely distributed in a passive medium or empty space, but rather with the phenomena of inverting the atoms in an entire block of solid, unlike any other kind of laser. Since the absorption and gain lengths in a semiconductor laser are very small compared to other lasers, this central fact greatly influences the choice of pumping scheme: active medium, heatsinking, cavity design, and sample geometry. Furthermore, semiconductors are crystals and their ordering implies spatial anisotropy (selection rules) and polarization, since polarization effects generally depend on crystal orientation.

A single bulk semiconductor is the simplest amplifying medium since it is cheap, readily available, and requires far less processing than heterostructure. To date, most optically pumped semiconductor lasers have used either crystal faces or closely attached mirrors as the cavity reflectors; this, unfortunately, prevents the insertion of tuning elements into the cavity and lowers its optical quality. Furthermore, because of high threshold pump powers and severe heating problems, semiconductor lasers in use today involve short pump pulses.

Additionally, most semiconductor crystals must be cooled to liquid nitrogen temperatures or below. Other problems arise with prior semiconductor lasers since a threshold of roughly 100 KW/cm requires a very tight beam focus for cw or quasi-cw lasing because the total power demanded by a larger spot size would destroy the crystal used therewith. The small spot size is also required to eliminate amplified spontaneous emission.

As is clearly evident from the description above, semiconductor lasers, and, in particular, optically pumped semiconductor lasers although potentially highly desirable currently have numerous drawbacks which render them less than effective under certain circumstances. It would be extremely beneficial to produce an optically pumped semiconductor laser which does not fall victim to the above-mentioned shortcomings.

SUMMARY OF THE INVENTION

The present invention overcomes the problems encountered in the past and as set forth in detail hereinabove by providing an optically pumped tunable semiconductor laser having an external resonant cavity.

The optically pumped tunable semiconductor laser of this invention relies upon the use of an external resonant cavity. This is accomplished by utilizing a semiconductor crystal in the form of, for example, a cadmium sulfide platelet crystal which is mounted on one side thereof to a support in the form of, for example, a piece of sapphire. The same side of the sapphire to which the semiconductor platelet is secured is also dielectrically coated with a maximum reflectivity mirror. This mirror acts as one end of the external resonant cavity of the laser of this invention. Completing the other end of the resonant cavity is a rotatably mounted 99.5% reflecting output mirror which is optically aligned with the sapphire mirror.

Optically interposed between the two end reflective surfaces or mirrors of the external cavity is a polarizing beamsplitter which allows for the introduction of an optical pump beam from a suitable source, such as an AR+ laser. Also included within the external cavity is a prism so that the laser beam which passes through the prism can be tuned by rotating the output mirror about its vertical axis. The pump beam is focused onto the crystal platelet to a spot size of approximately 5 micrometers by a 10× microscope objective which also serves to collimate the crystal fluorescence.

It is essential in this invention that the sapphire end mirror and semiconductor platelet crystal lasing medium be located within a cooling chamber for appropriate lasing action to take place. In addition, since the distance between the microscope objective and crystal is small (~7 mm) the microscope objective must also be placed within the cooling chamber.

The sapphire end mirror is held in place within the cooling chamber by a uniquely designed mount. Liquid nitrogen is thermally connected to the crystal/sapphire mount for cooling purposes. Also located within the vacuum/cooling chamber are other suitable mounts which permit movement of the sapphire end mirror and semiconductor platelet in three dimensions so that spots on different crystals can be utilized, the objective can be brought into focus, and proper alignment of the resonant cavity can be made.

Proper utilization of the prism located within the cavity in conjunction with the 99.5% output mirror enables the laser of this invention to be tuned to three different Fabry-Perot modes, covering the range between 495 and 501 nm. Within the strongest of these three modes the laser can be tuned to over 1.8 nm with a 0.1 nm bandwidth. The wavelengths between these modes can be reached by moving the crystal laterally so that the crystal Fabry-Perot length changes slightly. In addition, with a raise in temperature of the semiconductor crystal from 95 to 140 K., the laser wavelength can be increased from 497 to 504 nm. Further variance of the wavelength over this range can be accomplished by a combination of temperature and prism tuning. At temperatures above 140 K. the damage threshold is comparable to the laser threshold.

It is therefore an object of this invention to provide an optically pumped semiconductor laser having an external cavity.

It is also an object of this invention to provide a continuous wave optically pumped tunable semiconductor laser having an external cavity.

It is another object of this invention to provide a semiconductor laser in which there are no jet fluctuations, therefore eliminating a very strong source of noise.

It is still another object of this invention to provide a semiconductor laser which can be operated completely in a vacuum, eliminating atmospheric pressure fluctuations.

It is a further object of this invention to provide a semiconductor laser which allows a stabilized signal-frequency laser to operate with fewer wavelength selecting elements than in the past while tuning can be accomplished by a variance of the temperature.

It is still a further object of this invention to provide a semiconductor laser which is economical to produce and which utilizes conventional, currently available components that lend themselves to standard, mass producing, manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

Figure 1:
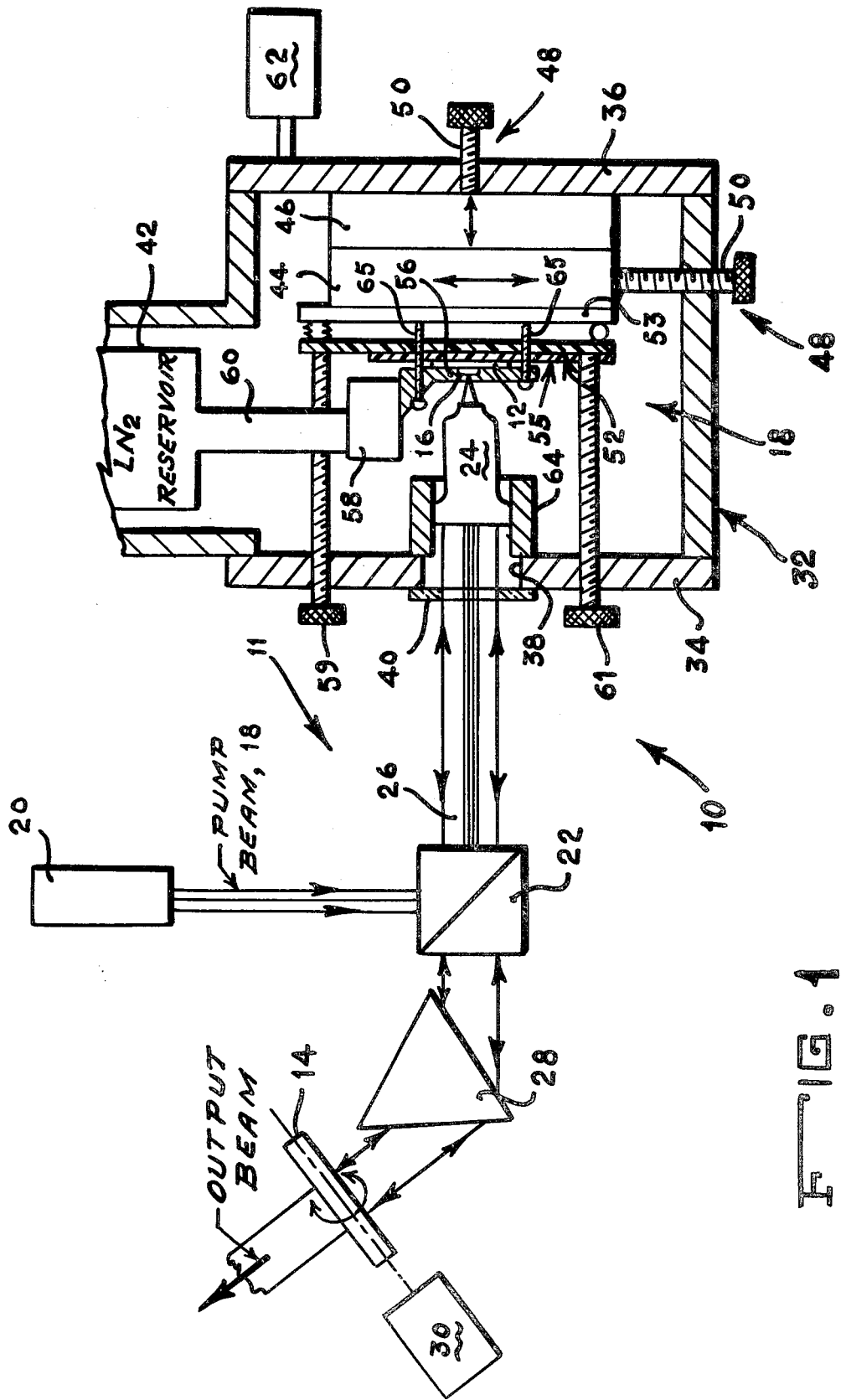
Figure 2:
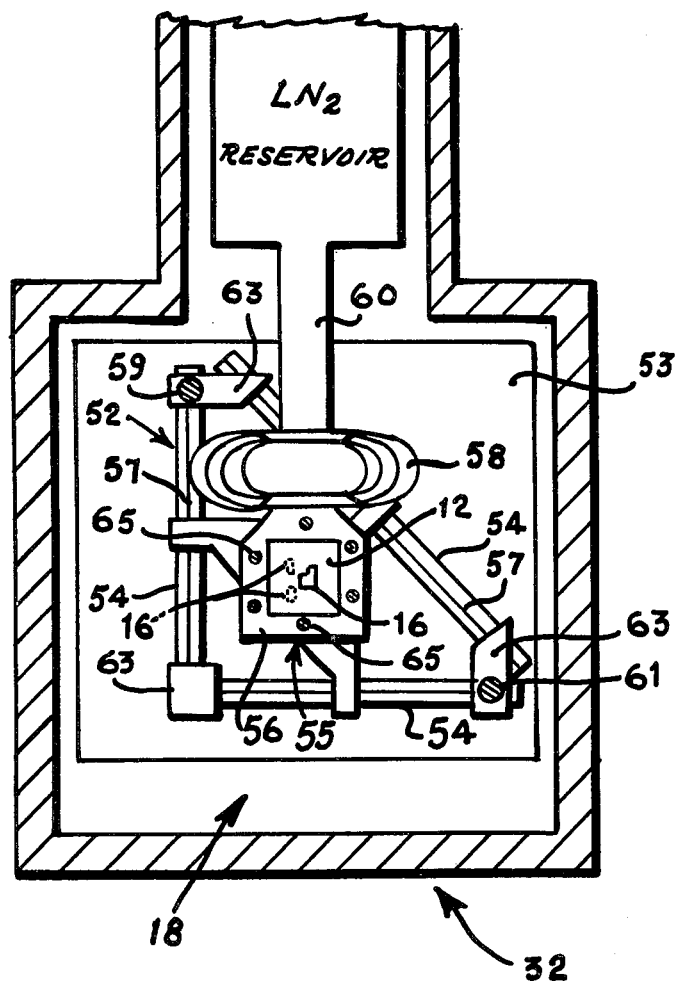

FIG. 1 is a side elevational view of the optically pumped tunable semiconductor laser of this invention shown partially in cross-section and schematic fashion; and FIG. 2 is a front view, shown partly in cross section, schematically illustrating the various components within the vacuum cooling chamber of the semiconductor laser of this invention.

DETAILED DESCRIPTION OF THE PREFERRED EMBODIMENT

Reference is now made to FIG. 1 of the drawing which clearly illustrates in schematic fashion the various components which make up the optically pumped tunable semiconductor laser 10 of this invention. Laser 10 of the present invention incorporates therein an external resonant cavity 11. Resonant cavity 11 is bounded at one end thereof by a first reflective element 12 in the form of, for example, a piece of sapphire being dielectrically coated on one side thereof with a maximum reflectivity mirror. The other end of the resonant cavity 11 is formed by a partially reflective, rotatable output element in the form of, for example, mirror 14 preferably having a 99.5% reflectivity.

The lasing medium of this invention is made up of a very thin ($<5$ $\mu$m) semiconductor crystal 16 such as cadmium sulfide (CdS), $CdS_xSe_{1-x}$ or $In_{1-x}Ga_x$-$As_yP_{1-y}$ which is chosen for flatness and parallism by observing under a microscope the interference patterns created by a sodium lamp. The semiconductor crystal 16 is mounted upon the reflective surface of sapphire 12 using a thin film of low viscosity silicone oil applied on sapphire 12 next to crystal 16. Semiconductor crystal 16 held in place on sapphire 16 by surface tension. The oil layer is often less than 5 micrometers thick and does not crack when cooled. The crystal-mirror sandwich is held in place within a vacuum/cooling chamber 18 for movement in three dimensions. This movement includes translational movement along the x, y axes as well as two tilting directions about the z axis in a manner to be explained in detail hereinbelow.

The lasing medium or semiconductor crystal 16 is optically pumped longitudinally by a laser beam 18 emanating from any suitable laser source 20 such as a continuous wave Ar+ laser. Pump beam 18 is directed into the resonant cavity 11 by a conventional polarizing beamsplitter 22 located therein. Focusing of pump beam 18 onto crystal 16 to a spot size of approximately 5 micrometers is accomplished by means of a conventional 10× microscope objective 24 which is adjustably positioned within vacuum/cooling chamber 18.

The laser beam 26 produced by semiconductor laser 10 of this invention is separated from pump beam 18 by polarizing beamsplitter 22 which transmits 98% of the CdS emission. In order to make this possible, the c-axis of the CdS crystal 16 is vertically oriented. Then its fluorescense which primarily has ELc, is polarized perpendicularly to the vertically polarized optically pumping laser beam 18.

Also located within the resonant cavity 11 is a prism 28 through which laser beam 26 is passed. The output beam can be tuned by appropriately rotating output mirror 14 about its vertical axis as shown by the arrow in FIG. 1. Rotational movement of mirror 14 can be accomplished either manually or by any conventional rotating device such as motor 30.

Reference is now made to the vacuum/cooling chamber 18 shown in both FIGS. 1 and 2 of the drawing. It is essential in the optically pumped tunable semiconductor laser 10 of this invention to locate the lasing medium, that is, semiconductor crystal 16, in a vacuum in which cooling thereof can take place. The vacuum/cooling chamber 18 forming part of this invention is not only capable of accommodating crystal 16 under the appropriate temperature conditions, but is also capable of moving crystal 16 along the x-y axis as well as tilting crystal 16 about the z axis.

More specifically, vacuum/cooling chamber 18 is made up of a housing 32 preferably being of a tubular configuration having a substantially square cross section as shown in FIG. 2 of the drawing. Although not limited to the following dimensions, optimum outputs can be obtained with laser 10 of this invention with chamber 18 being a stainless steel tube having a square cross-section approximately 15×15 centimeters by 11 centimeters in length having a 1.0 centimeter wall thickness.

A pair of end plates 34 and 36 seal the tube with one of the end plates 34 having a centrally located opening 38 therein covered by a transparent material 40, transparent to the wavelengths of interest so as to permit passage therethrough of both the optical pumping beam 18 and laser beam 26. Any conventional coolant reservoir 42 is situated on top of the housing 32 and preferably contains liquid nitrogen which is used for cooling purposes. Both the microscope objective 24 and the crystal/mirror sandwich are located within the confines of the vacuum/cooling chamber 18 in a manner to be described in detail hereinbelow.

Reference is once again made to FIGS. 1 and 2 of the drawing for a detailed description of the cooling and mounting arrangement for crystal 16. Two translational stages 44 and 46, preferably in the form of Klinger model MRS 80 25 are secured to back plate 36 of chamber 18 and crystal/sapphire sandwich described below to allow the translational movement of the crystal/mirror sandwich to take place in the directions indicated by the arrows shown in FIG. 1. These translational stages 44 and 46 are controlled by conventional micrometer heads 48 located outside of chamber 18 and which protrude through the walls of vacuum/cooling chamber 18. The spindles 50 of the micrometer heads 48 are pushed directly against the respective sides of translational stages 44 and 46 so as to allow the appropriate movement of the crystal/mirror sandwich with micron accuracy.

Crystal 16 and sapphire 12 are centrally located and optically aligned with the laser and pumping beams 18 and 26, respectively, and held in position by mounting assembly 52 and a mounting plate 53 preferably made of steel. As clearly illustrated in FIG. 2, mounting assembly 52 is in the form of a triangular-shaped structure supported by mounting plate 53 for slight movement therewith with respect to housing 32. The triangular structure includes a plurality of quartz tubing 54 and a quartz central support 55 slidably mounted thereon for coarse adjustment. Mounting assembly 52 can be tilted in two directions with respect to plate 53 by turning a pair of screws 59 and 61 located at the corners of mounting assembly 52 as shown in FIG. 1. The screws are connected to vacuum feedthroughs with electroformed nickel bellows (not shown) and can be adjusted while the laser is in operation. Quartz tubing is used for the material of mounting assembly 52 because it exhibits low thermal conductivity and very low thermal expansion, minimizing stresses generated when crystal 16 is cooled down. As shown in FIG. 2, three pieces of quartz tubing 54 are interconnected by stainless steel connectors 63 to complete mounting assembly 52.

Sapphire mirror 12 is clamped to the quartz crystal support 55 by a stiff copper ring 56 and a plurality of screws 65. A thin sheet of indium (not shown) may be provided between sapphire mirror 12 and copper ring 56 in order to insure a good thermal connection therebetween. The stiff copper support ring 56 is soft soldered to a flexible copper loop 58 which is made up of approximately 20 wraps of thin copper sheet. This loop 58 allows transverse movement of mounting plate 55 and crystal 16 to take place by more than 1.5 cm in both directions.

More specifically, loop 58 is made up of a spiral of a single piece of copper 250 cm×2.5 cm×50 μm brazed together at the top and bottom. The top of the loop 58 is connected to a hollow cold finger 60 operably connected to the liquid nitrogen reservoir 42. It is possible, if so desired, to loosely surround the quartz triangular shaped mounting assembly 52 and copper loop 58 by three layers of "super-insulation" such as aluminized Mylar foil in order to reduce radiated heat losses.

The vacuum-cooling chamber 18 can be pumped to a pressure of 20 m torr before lasing operation commences by any conventional vacuum pump 62. A charcoal dessicant further reduces convection losses. Temperature on mounting assembly 52 can be measured by 3 platinum RTD detectors (not shown) if desired.

The microscope objective 24 (Leitz EF 10/.25P) located within vacuum/cooling chamber 18 is chosen for its relatively low reflection losses, roughly approximately 4% per pass. It is slidably connected by means of outstanding element 64 to front plate 34 of chamber 18. Objective 24 can be moved parallel to the beam 26 for appropriate focusing onto crystal 16 by any conventional means (not shown). Typically, lasing can be accomplished over a range of 200 μm in the focal distance for a cavity length 1.8 meters.

The vacuum/cooling chamber 18 maintains crystal 16 at a stable temperature of approximately 82 K. It is capable of cooling down from room temperature in approximately ten minutes, and the 380 ml capacity of the liquid nitrogen reservoir 42 is sufficient to hold the temperature substantially constant for over six hours without refilling.

With prism 28 inserted within resonant cavity 11 and with a 99.5% output mirror 14, semiconductor laser 10 of this invention can be tuned to three different Fabry-Perot modes, covering the range between 495 and 501 nm. With the strongest of these three modes, it can be tuned over 1.8 nm with a 0.1 nm bandwidth. The wavelength between these modes can be reached by moving crystal 16 laterally so that the Fabry-Perot length changes slightly. In addition, when the temperature of crystal 16 is raised from 95 to 140 K., the laser wavelength increases from 497 to 504 nm. The wavelength can be varied continuously over this range by a combination of temperature and prism tuning and by the use of rotational output mirror 14.

Although this invention has been described with reference to a particular embodiment, it will be understood that this invention is also capable of further and other embodiments within the spirit and scope of the appended claims. For example, although an Ar+ laser 20 is generally utilized as the pumping laser, lasing could also be accomplished with the 488-, 473-, and 458-nm lines. Thus, pumping even 200 meV above the band gap is possible without absorbion-depth problems.

It is further possible with this invention to extend the use of laser 10 to a variety of other semiconductor elements such as, for example, CdSe CdSSe and InGaAsP crystals using a 514-nm Ar+ pump or other pump sources such as a Kr+ laser. Furthermore, several crystals can be mounted adjacent each other on the same sapphire mirror 12 as shown in phantom in FIG. 2, yielding a laser 10 which is easily tunable from 500 to 700 nm. Other crystals of ZnCdS can also be used. Heating problems in crystal 16 might be further reduced by the use of epitaxial layers of CdS grown on sapphire 12.

The semiconductor laser 10 of this invention eliminates jet fluctuations which are generally present in dye lasers and which are generally a very strong source of noise. In addition, laser 10 can be operated completely in a vacuum, eliminating atmospheric pressure fluctuations present in dye laser cavities.

In addition, the spontaneous-emission spectrum is narrower with semiconductor laser 10 than those of dyes, allowing a stabilized signal-frequency laser to operate with fewer wavelength selecting elements, while tuning can be accomplished by varying the temperature within vacuum/cooling chamber 18. Furthermore, laser 10 of this invention has the capability for single-frequency operation tunable throughout most of the visible and the near IR region.

We claim:
1. A semiconductor platelet laser comprising:
a resonant cavity having a first reflective element being partially transmissive at one end thereof and a second reflective element being substantially totally reflective optically aligned with said first reflective element at the other end thereof;

a semiconductor lasing medium mounted adjacent said second reflective element within said resonant cavity;

means for providing a beam of electromagnetic radiation for pumping said laser;

means optically interposed within said resonant cavity for directing said pump beam into said resonant cavity and for passing an output laser beam therethrough;

means for providing a vacuum and temperature controlled environment surrounding said semiconductor lasing medium and said second reflective element; and means optically interposed within said resonant cavity for focusing said pump beams onto said semiconductor lasing medium;

whereby said pump beam initiates lasing action within said resonant cavity and said laser beam outputs from said resonant cavity through said first reflective element.

2. A semiconductor platelet laser as defined in claim 1 further comprising a prism optically interposed within said resonant cavity, and means operably connected to said first reflective element for rotating said first reflective element about its vertical axis thereby enabling said semiconductor laser to be tuned.

3. A semiconductor platelet laser as defined in claim 2 wherein said pumping means comprises a continuous wave laser.

4. A semiconductor platelet laser as defined in claim 1 further comprising means for moving said semiconductor lasing medium and said second reflective element in three dimensions.

5. A semiconductor platelet laser as defined in claim 4 wherein said vacuum and temperature controlled environment providing means comprises a housing, means operably connected to the interior of said housing for providing a vacuum therein, and means operably connected to said second reflective element for controlling the temperature of said semiconductor lasing medium and said second reflective element.

6. A semiconductor platelet laser as defined in claim 5 wherein said focusing means is adjustably mounted within said housing.

7. A semiconductor platelet laser as defined in claim 6 wherein said temperature controlling means comprises a source of coolant and means for thermally connecting said coolant to said second reflective element.

8. A semiconductor platelet laser as defined in claim 7 wherein said coolant connecting means comprises a coiled loop of conductive material.

9. A semiconductor platelet laser as defined in claim 3 further comprising means for moving said semiconductor lasing medium and said second reflective element in three dimensions.

10. A semiconductor platelet laser as defined in claim 9 wherein said three dimensions include translational movement along the x, y axes and tilting movement along the z axis.

11. A semiconductor platelet laser as defined in claim 10 wherein said vacuum and temperature controlled environment providing means comprises a housing, means operably connected to the interior of said housing for providing a vacuum therein, and means operably connected to said second reflective element for controlling the temperature of said semiconductor lasing medium and said second reflective element.

12. A semiconductor platelet laser as defined in claim 11 wherein said focusing means is adjustably mounted within said housing.

13. A semiconductor platelet laser as defined in claim 12 wherein said semiconductor lasing medium comprises a cadmium sulfide crystal platelet.

14. A semiconductor platelet laser as defined in claim 13 wherein said second reflective element is in the form of a piece of sapphire.

* * * * *